United States Patent
Yu et al.

(10) Patent No.: US 9,871,113 B2
(45) Date of Patent: Jan. 16, 2018

(54) SEMICONDUCTOR PROCESS

(71) Applicant: United Microelectronics Corp., Hsinchu (TW)

(72) Inventors: Chun-Wei Yu, Tainan (TW); Kuang-Hsiu Chen, Tainan (TW); Chueh-Yang Liu, Tainan (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/064,275

(22) Filed: Mar. 8, 2016

(65) Prior Publication Data

US 2017/0263730 A1  Sep. 14, 2017

(51) Int. Cl.
*H01L 21/02* (2006.01)
*H01L 21/266* (2006.01)
*H01L 29/66* (2006.01)
*H01L 29/49* (2006.01)

(52) U.S. Cl.
CPC .... *H01L 29/66492* (2013.01); *H01L 21/0223* (2013.01); *H01L 21/0234* (2013.01); *H01L 21/02164* (2013.01); *H01L 21/02255* (2013.01); *H01L 21/266* (2013.01); *H01L 29/4916* (2013.01); *H01L 29/66545* (2013.01)

(58) Field of Classification Search
CPC ............. H01L 29/7848; H01L 29/6656; H01L 29/665; H01L 29/66545; H01L 29/66628; H01L 29/66636; H01L 21/823814; H01L 21/30604; H01L 21/31111; H01L 21/02636; H01L 29/6659; H01L 29/66492; H01L 21/02532; H01L 21/02255; H01L 21/02164
See application file for complete search history.

(56) References Cited

U.S. PATENT DOCUMENTS

| | | | |
|---|---|---|---|
| 8,614,128 B1 * | 12/2013 | Thompson ...... | H01L 21/823807 257/E21.63 |
| 2004/0097047 A1 * | 5/2004 | Natzle ............... | H01L 21/28035 438/300 |
| 2005/0124126 A1 * | 6/2005 | Wu .................... | H01L 21/28518 438/303 |
| 2007/0117284 A1 * | 5/2007 | Imai ..................... | H01L 21/0214 438/151 |

(Continued)

OTHER PUBLICATIONS

Ming-Yueh Tsai et al., "Semiconductor Device and Method for Fabricating the Same," Unpublished U.S. Appl. No. 14/940,120, filed Nov. 12, 2015.

*Primary Examiner* — Caridad Everhart
(74) *Attorney, Agent, or Firm* — J.C. Patents

(57) ABSTRACT

A semiconductor process including the following steps is provided. An epitaxial layer is formed on a substrate. An oxide layer is formed on the epitaxial layer, wherein the oxide layer includes a chemical oxide layer, a high-temperature oxide (HTO) layer or a surface modification oxide layer. An ion implant process is performed to the epitaxial layer to form a doped region in the epitaxial layer. The oxide layer is removed by using a diluted hydrofluoric acid (DHF) solution after performing the ion implant process, wherein a volume ratio of water to a hydrofluoric acid (HF) in the DHF solution is 200:1 to 1000:1.

16 Claims, 1 Drawing Sheet

(56) References Cited

U.S. PATENT DOCUMENTS

| | | | |
|---|---|---|---|
| 2007/0224760 A1* | 9/2007 | Matsui | C09G 1/02 |
| | | | 438/257 |
| 2009/0039426 A1* | 2/2009 | Cartier | H01L 21/28079 |
| | | | 257/344 |
| 2014/0273375 A1* | 9/2014 | Javorka | H01L 21/823418 |
| | | | 438/275 |
| 2015/0263003 A1* | 9/2015 | Lee | H01L 27/0922 |
| | | | 257/351 |

* cited by examiner

SEMICONDUCTOR PROCESS

BACKGROUND OF THE INVENTION

Field of the Invention

The invention relates to a semiconductor process, and particularly relates to a semiconductor process capable of well controlling the removal time of the oxide layer on the epitaxial layer.

Description of Related Art

Currently, an oxide layer formed on an epitaxial layer is removed by using a chemical solution after a doped region is formed in the epitaxial layer by performing the ion implant process. However, the removal time of the oxide layer is not easy to control. If the removal time of the oxide layer is too long, the loss of the epitaxial layer is increased. On the other hand, if the removal time of the oxide layer is too short, oxide layer residue remains on the epitaxial layer, and the contact opening would not expose the epitaxial layer sufficiently.

SUMMARY OF THE INVENTION

The invention provides a semiconductor process which can well control the removal time of the oxide layer on the epitaxial layer.

The invention provides a semiconductor process including the following steps. An epitaxial layer is formed on a substrate. An oxide layer is formed on the epitaxial layer, wherein the oxide layer includes a chemical oxide layer, a high-temperature oxide (HTO) layer or a surface modification oxide layer. An ion implant process is performed to the epitaxial layer to form a doped region in the epitaxial layer. The oxide layer is removed by using a DHF solution after performing the ion implant process, wherein a volume ratio of water to a hydrofluoric acid (HF) in the DHF solution is 200:1 to 1000:1.

According to an embodiment of the invention, in the semiconductor process, the substrate includes a planar substrate or a three-dimensional substrate with a fin structure.

According to an embodiment of the invention, in the semiconductor process, the epitaxial layer includes a silicon germanium (SiGe) epitaxial layer or a silicon-phosphorus (SiP) epitaxial layer.

According to an embodiment of the invention, in the semiconductor process, the epitaxial layer is the SiP epitaxial layer, and a depth of a divot of the SiP epitaxial layer is less than 30 angstroms after removing the oxide layer, for example.

According to an embodiment of the invention, in the semiconductor process, a method for forming the epitaxial layer includes performing a selective epitaxial growth (SEG) process.

According to an embodiment of the invention, in the semiconductor process, a material of the oxide layer includes silicon oxide.

According to an embodiment of the invention, in the semiconductor process, a thickness of the oxide layer is 5 angstroms to 20 angstroms, for example.

According to an embodiment of the invention, in the semiconductor process, a method for forming the chemical oxide layer includes using a sulfuric acid peroxide mixture (SPM) solution.

According to an embodiment of the invention, in the semiconductor process, the SPM solution may contain ozone.

According to an embodiment of the invention, in the semiconductor process, a method for forming the HTO layer includes performing a thermal oxidation process.

According to an embodiment of the invention, in the semiconductor process, a modification method for the surface modification oxide layer includes performing a plasma treatment or an implant treatment.

According to an embodiment of the invention, in the semiconductor process, the doped region included a source/drain region or a lightly doped drain (LDD) region.

According to an embodiment of the invention, in the semiconductor process, the volume ratio of the water to the HF in the DHF solution is 300:1 to 1000:1, for example.

According to an embodiment of the invention, in the semiconductor process, the volume ratio of the water to the HF in the DHF solution is 500:1 to 1000:1, for example.

According to an embodiment of the invention, the semiconductor process further includes forming a gate structure on the substrate at a side of the epitaxial layer.

According to an embodiment of the invention, in the semiconductor process, the oxide layer may be extended on a surface of the gate structure.

According to an embodiment of the invention, in the semiconductor process, the gate structure includes a gate and a dielectric layer. The gate is disposed on the substrate. The dielectric layer is disposed between the gate and the substrate.

According to an embodiment of the invention, in the semiconductor process, the gate includes a dummy gate or a doped polysilicon gate.

According to an embodiment of the invention, in the semiconductor process, the gate structure further includes a hard mask layer disposed on the gate.

According to an embodiment of the invention, in the semiconductor process, the gate structure further includes a spacer disposed on a sidewall of the gate.

Based on the above description, in the semiconductor process of the invention, the oxide layer includes a chemical oxide layer, a HTO layer or a surface modification oxide layer, and the oxide layer is removed by using the DHF solution with the volume ratio of the water to the HF in the DHF solution being 200:1 to 1000:1. Therefore, the removal time of the oxide layer can be well controlled, such that the loss of the epitaxial layer can be decreased, the oxide layer residue may not remain on the epitaxial layer, and the contact opening can expose the epitaxial layer sufficiently.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
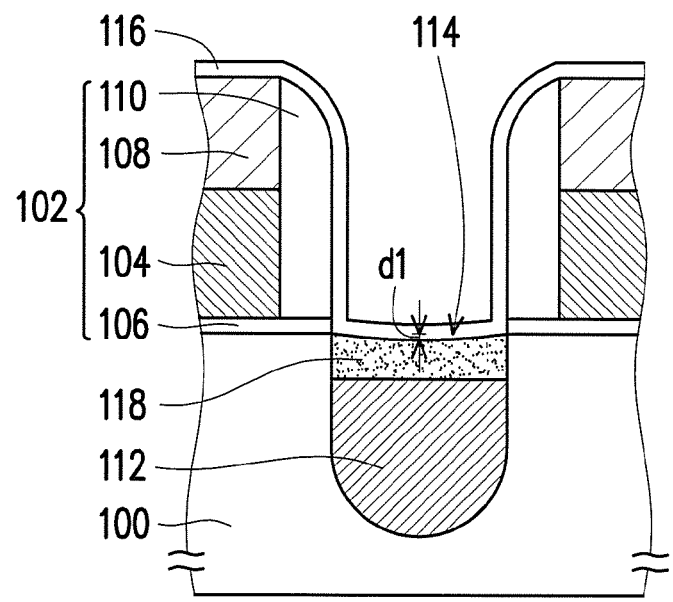
FIG. 1A.
Figure 1B:
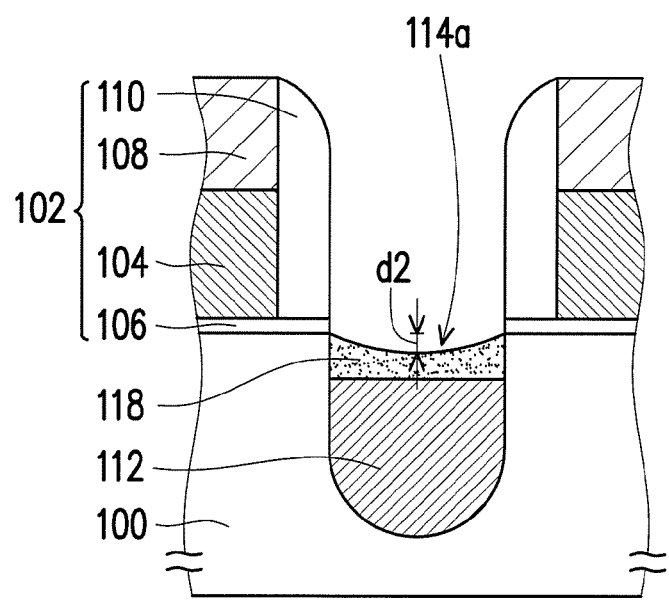
FIG. 1B. are cross-sectional views illustrating a semiconductor process according to an embodiment of the invention.

FIG. 1A. and FIG. 1B. are cross-sectional views illustrating a semiconductor process according to an embodiment of the invention.

Referring to FIG. 1A, at least one gate structure 102 may be selectively formed on a substrate 100. The substrate 100 includes a planar substrate or a three-dimensional substrate 100 with a fin structure. In this embodiment, the number of the at least one gate structure 102 is exemplified as 2, but the invention is not limited thereto.

The gate structure 102 may include a gate 104 and a dielectric layer 106. The gate 104 is disposed on the substrate 100. The gate 104 includes a dummy gate or a doped polysilicon gate. The dummy gate may be used as a sacrifice layer in a manufacturing process of a metal gate. A material of the dummy gate is polysilicon, for example. The dielectric layer 106 is disposed between the gate 104 and the substrate 100. A material of the dielectric layer 106 is silicon oxide, for example.

The gate structure 102 may further include a hard mask layer 108 disposed on the gate 104. The hard mask layer 108 may be a single-layer structure or a multi-layer structure. A material of the hard mask layer 108 is silicon oxide, silicon nitride, or a combination thereof, for example. A method for forming the dielectric layer 106, the gate 104 and the hard mask layer 108 is a combination of film formation, photolithography, and etching processes, for example.

The gate structure 102 may further include a spacer 110 disposed on a sidewall of the gate 104. The spacer 110 may be further disposed on a sidewall of the hard mask layer 108. The spacer 110 may be a single-layer structure or a multi-layer structure. A material of the spacer 110 is silicon nitride, for example. A method of forming the spacer 110 may include the following steps, but the invention is not limited thereto. A spacer material layer (not shown) covering the hard mask layer 108, the gate 104 and the dielectric layer 106 is formed, and then an etching-back process is performed to the spacer material layer.

An epitaxial layer 112 is formed on a substrate 100. The epitaxial layer 112 includes a silicon germanium (SiGe) epitaxial layer or a silicon-phosphorus (SiP) epitaxial layer. A method of forming the epitaxial layer 112 may include the following steps, but the invention is not limited thereto. A recess (not shown) is formed in the substrate 100, and the epitaxial layer 112 is formed in the recess by performing a selective epitaxial growth (SEG) process. In this embodiment, epitaxial layer 112 is exemplified as the SiP epitaxial layer, and the SiP epitaxial layer 112 may have a divot 114, but the invention is not limited thereto.

An oxide layer 116 is formed on the epitaxial layer 112, wherein the oxide layer 116 includes a chemical oxide layer, a high-temperature oxide (HTO) layer or a surface modification oxide layer. The gate structure 102 is located on the substrate 100 at a side of the epitaxial layer 112, for example. The oxide layer 116 may be extended on a surface of the gate structure 102. A material of the oxide layer 116 includes silicon oxide. A thickness of the oxide layer 116 is 5 angstroms to 20 angstroms, for example. A method for forming the chemical oxide layer includes using a sulfuric acid peroxide mixture (SPM) solution. Furthermore, the SPM solution may contain ozone, wherein the ozone is conducive to form the chemical oxide layer. A method for forming the HTO layer includes performing a thermal oxidation process. A modification method for the surface modification oxide layer includes performing a plasma treatment or an implant treatment.

An ion implant process is performed to the epitaxial layer 112 to form a doped region 118 in the epitaxial layer 112. The doped region 118 included a source/drain region or a lightly doped drain (LDD) region. The doped region 118 may be an N-type doped region or a P-type doped region. A person having ordinary skill in the art may select the doping type according to the product design requirements.

Referring to FIG. 1B, the oxide layer 116 is removed by using a diluted hydrofluoric acid (DHF) solution after performing the ion implant process, wherein a volume ratio of water to a hydrofluoric acid (HF) in the DHF solution is 200:1 to 1000:1. In one embodiment, the volume ratio of the water to the HF in the DHF solution may be 300:1 to 1000:1. In another embodiment, the volume ratio of the water to the HF in the DHF solution may be 500:1 to 1000:1. In the process of removing the oxide layer 116, a portion of the epitaxial layer 112 may be removed to form a divot 114a, and a depth d2 of the divot 114a is deeper than a depth d1 of the divot 114 (FIG. 1A). In this embodiment, the depth d2 of a divot 114a of the SiP epitaxial layer 112 is less than 30 angstroms after removing the oxide layer 116, for example.

Based on the aforementioned embodiments, the oxide layer 116 includes a chemical oxide layer, a HTO layer or a surface modification oxide layer, and the oxide layer 116 is removed by using the DHF solution with the volume ratio of the water to the HF in the DHF solution being 200:1 to 1000:1. Therefore, the removal time of the oxide layer 116 can be well controlled, such that the loss of the epitaxial layer 112 can be decreased, the oxide layer residue may not remain on the epitaxial layer 112, and the contact opening can expose the epitaxial layer 112 sufficiently.

In summary, the semiconductor process of the aforementioned embodiments can well control the removal time of the oxide layer, such that the damage to the epitaxial layer caused by the DHF solution can be decreased, and the contact opening can expose the epitaxial layer sufficiently.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor process, comprising:
    forming an epitaxial layer on a substrate;
    forming an oxide layer on the epitaxial layer, wherein the oxide layer comprises a chemical oxide layer, a high-temperature oxide (HTO) layer or a surface modification oxide layer;
    performing an ion implant process to the epitaxial layer to form a doped region in the epitaxial layer; and
    removing the oxide layer by using a diluted hydrofluoric acid (DHF) solution after performing the ion implant process, wherein a volume ratio of water to a hydrofluoric acid (HF) in the DHF solution is 200:1 to 1000:1,
    wherein the epitaxial layer is a silicon-phosphorus (SiP) epitaxial layer, and a depth of a divot of the SiP epitaxial layer is less than 30 angstroms after removing the oxide layer.

2. The semiconductor process of claim 1, wherein the substrate comprises a planar substrate or a three-dimensional substrate with a fin structure.

3. The semiconductor process of claim 1, wherein a method for forming the epitaxial layer comprises performing a selective epitaxial growth (SEG) process.

4. The semiconductor process of claim 1, wherein a method for forming the HTO layer comprises performing a thermal oxidation process.

5. The semiconductor process of claim 1, wherein a modification method for the surface modification oxide layer comprises performing a plasma treatment or an implant treatment.

6. The semiconductor process of claim 1, wherein the doped region comprised a source/drain region or a lightly doped drain (LDD) region.

7. The semiconductor process of claim 1, wherein a method for forming the chemical oxide layer comprises using a sulfuric acid peroxide mixture (SPM) solution.

8. The semiconductor process of claim 7, wherein the SPM solution contains ozone.

9. The semiconductor process of claim 1, wherein the volume ratio of the water to the HF in the DHF solution is 300:1 to 1000:1.

10. The semiconductor process of claim 9, wherein the volume ratio of the water to the HF in the DHF solution is 500:1 to 1000:1.

11. The semiconductor process of claim 1, further comprising forming a gate structure on the substrate at a side of the epitaxial layer.

12. The semiconductor process of claim 11, wherein the oxide layer is extended on a surface of the gate structure.

13. The semiconductor process of claim 11, wherein the gate structure comprises:
   a gate, disposed on the substrate; and
   a dielectric layer, disposed between the gate and the substrate.

14. The semiconductor process of claim 13, wherein the gate comprises a dummy gate or a doped polysilicon gate.

15. The semiconductor process of claim 13, wherein the gate structure further comprises a hard mask layer disposed on the gate.

16. The semiconductor process of claim 13, wherein the gate structure further comprises a spacer disposed on a sidewall of the gate.

* * * * *